(12) United States Patent
Shen

(10) Patent No.: US 6,246,109 B1
(45) Date of Patent: Jun. 12, 2001

(54) SEMICONDUCTOR DEVICE AND METHOD FOR FABRICATING THE SAME

(76) Inventor: Ming-Tung Shen, 4F, No. 52, Sec. 2, Chung-Shan N. Rd., Taipei City (TW)

( * ) Notice: Subject to any disclaimer, the term of this patent is extended or adjusted under 35 U.S.C. 154(b) by 0 days.

(21) Appl. No.: 09/400,592

(22) Filed: Sep. 22, 1999

(30) Foreign Application Priority Data

Aug. 5, 1999 (TW) ................................................ 88113399
Aug. 5, 1999 (TW) ................................................ 88213225

(51) Int. Cl.$^7$ ................................................ H01L 23/495
(52) U.S. Cl. ........................ 257/668; 257/673; 257/676
(58) Field of Search ................................ 257/676, 783, 257/668, 673, 690, 693

(56) References Cited

U.S. PATENT DOCUMENTS

| 4,303,934 | | 1/1981 | Stitt . | |
|---|---|---|---|---|
| 5,559,366 | * | 9/1996 | Fogal et al. ........................ | 257/666 |
| 5,892,271 | * | 4/1999 | Takeda et al. ........................ | 257/668 |
| 6,013,944 | * | 1/2000 | Moriya et al. ........................ | 257/668 |
| 6,114,013 | * | 9/2000 | Hotta ........................ | 428/192 |

FOREIGN PATENT DOCUMENTS

| 0 475 022 | 3/1992 | (EP) . |
|---|---|---|
| 63-209152 | 8/1988 | (JP) . |
| 8306840 | 11/1995 | (JP) . |
| 8264706 | 10/1996 | (JP) . |

\* cited by examiner

*Primary Examiner*—Eddie C. Lee
*Assistant Examiner*—Lourdes Cruz
(74) *Attorney, Agent, or Firm*—Merchant & Gould P.C.

(57) ABSTRACT

A semiconductor device includes a lead frame, a dielectric tape layer, a plurality of conductive contacts and a semiconductor die. The lead frame is provided with a plurality of leads. The dielectric tape layer has a first adhesive surface adhered onto the leads, and a second adhesive surface opposite to the first adhesive surface. The dielectric tape layer is formed with a plurality of holes at positions registered with the leads for access thereto. Each of the holes is confined by a wall that cooperates with a registered one of the leads to form a contact receiving space. The conductive contacts are placed in the contact receiving spaces, respectively. The die has a die mounting surface adhered onto the second adhesive surface of the dielectric tape layer. The die mounting surface is provided with a plurality of contact pads that are bonded to the conductive contacts to establish electrical connection with the leads of the lead frame. A method for fabricating the semiconductor device is also disclosed.

15 Claims, 8 Drawing Sheets

SEMICONDUCTOR DEVICE AND METHOD FOR FABRICATING THE SAME

BACKGROUND OF THE INVENTION

1. Field of the Invention

The invention relates to a semiconductor device and a method for fabricating the same, more particularly to a semiconductor device and a method for fabricating the same that can enhance production yield and that can reduce production costs.

2. Description of the Related Art

Referring to FIGS. 1 to 4, a conventional method for fabricating a semiconductor device is shown. As shown in FIG. 1, a die 10 having an upper surface provided with a plurality of solder pads 100 is attached to a tie bar 130 on a lead frame 13 by means of a double-side adhesive tape 12 to fix the die 10 on the lead frame 13. The solder pads 100 are exposed via a bore 1300 formed in the tie bar 130, as shown in FIG. 4. Referring to FIG. 2, each of the solder pads 100 is connected electrically to a respective lead 131 of the lead frame 13 via known wire bonding techniques by means of a conductive wire 14 that extends through the bore 1300. Referring to FIG. 3, a plastic protective layer 15 formed from a moulding compound is used to encapsulate the die 10 and a portion of the lead frame 13 to form the semiconductor device.

The following are some of the drawbacks of the conventional method for fabricating the semiconductor device:

1. The aforesaid method needs conductive wires 14 for connecting electrically the solder pads 100 and the leads 131, respectively, thereby requiring an expensive wire bonder that leads to higher fabricating costs.
2. In the aforesaid method, because there is a height difference between the solder pads 100 and the leads 131, wire bonding is unstable and inconvenient to conduct, thereby resulting in a relatively low production yield.
3. In the aforesaid method, when the die 10 needs to be inspected, it will take a relatively long time to remove the plastic protective layer 15 from the die 10, thereby further increasing the fabricating costs.

SUMMARY OF THE INVENTION

Therefore, the object of the present invention is to provide a semiconductor device and a method for fabricating the same which can overcome the drawbacks associated with the aforesaid prior art.

According to one aspect of the present invention, a semiconductor device includes a lead frame, a dielectric tape layer, a plurality of conductive contacts and a semiconductor die.

The lead frame is provided with a plurality of leads.

The dielectric tape layer has a first adhesive surface adhered onto the leads, and a second adhesive surface opposite to the first adhesive surface. The dielectric tape layer is formed with a plurality of holes at positions registered with the leads for access thereto. Each of the holes is confined by a wall that cooperates with a registered one of the leads to form a contact receiving space.

The conductive contacts are placed in the contact receiving spaces, respectively.

The die has a die mounting surface adhered onto the second adhesive surface of the dielectric tape layer. The die mounting surface is provided with a plurality of contact pads that are bonded to the conductive contacts to establish electrical connection with the leads of the lead frame.

According to another aspect of the present invention, a method for fabricating the semiconductor device comprises:

adhering a first adhesive surface of a dielectric tape layer on a plurality of leads that are provided on a lead frame, the dielectric tape layer being formed with a plurality of holes at positions registered with the leads for access thereto, each of the holes being confined by a wall that cooperates with a registered one of the leads to form a contact receiving space;

placing a plurality of conductive contacts in the contact receiving spaces, respectively; and adhering a die mounting surface of a semiconductor die onto a second adhesive surface of the dielectric tape layer opposite to the first adhesive surface, and bonding a plurality of contact pads that are provided on the die mounting surface of the semiconductor die to the conductive contacts to establish electrical connection with the leads of the lead frame.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
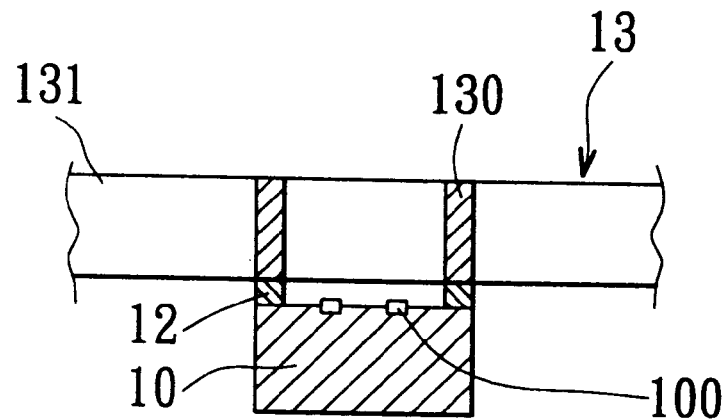
FIGS. 1 to 3 are fragmentary schematic, partly sectional views illustrating a conventional method for fabricating a semiconductor device.
Figure 2:
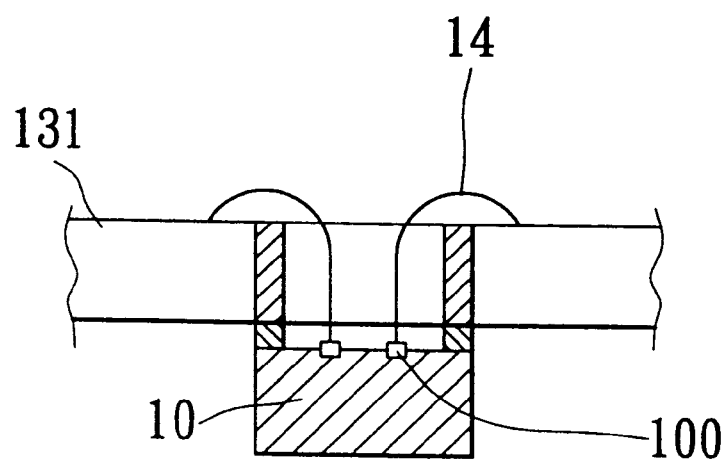
Figure 3:
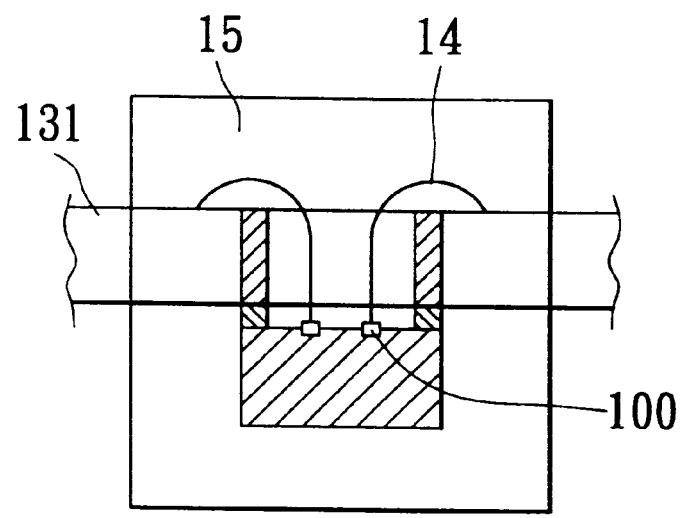
Figure 4:
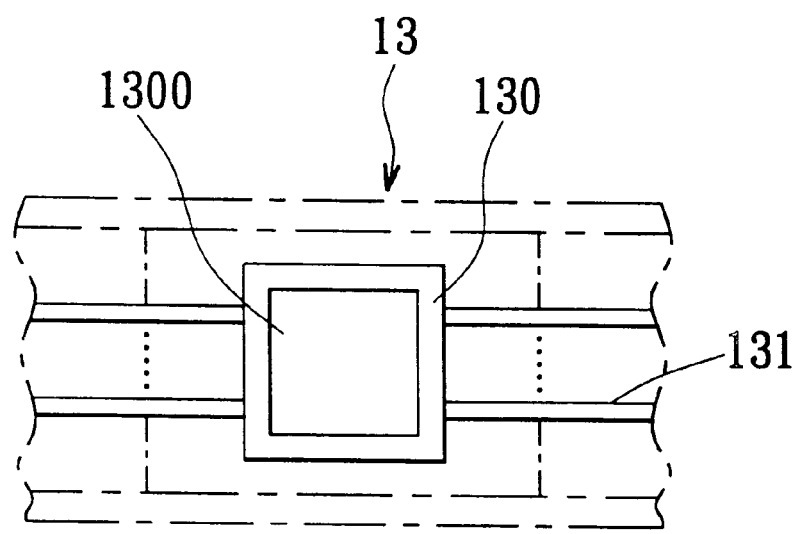
FIG. 4 is a top view showing a lead frame used in the conventional method for fabricating a semiconductor device.

Before the present invention is described in greater detail, it should be noted that like elements are denoted by the same reference numerals throughout the disclosure.

Referring to FIGS. 5 to 9, the first preferred embodiment of a semiconductor device 2 according to the present invention is shown to include a lead frame 3, two dielectric tape layers 4 and a semiconductor die 5.

The lead frame 3 is provided with a plurality of leads 30 at left and right sides thereof.

Figure 5:
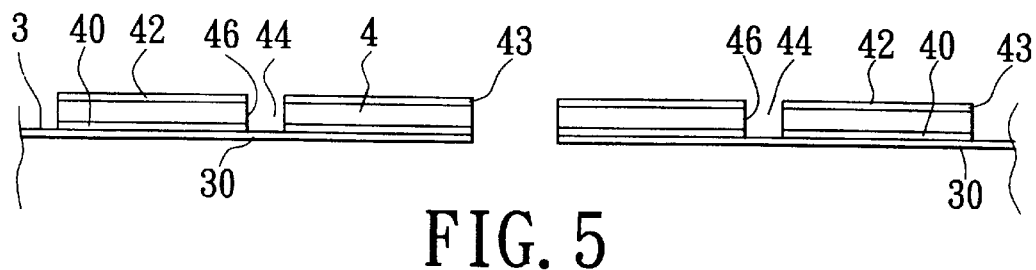
FIGS. 5 to 8 are fragmentary schematic, partly sectional views illustrating the steps of the method for fabricating the first preferred embodiment of a semiconductor device according to the present invention.

Each of the dielectric tape layers 4 has a first adhesive surface 40 adhered onto the leads 30 by heat-curing of a heat-curable adhesive that is provided thereon, and a second adhesive surface 42 opposite to the first adhesive surface 40. A conventional laser cutting technique is employed to form a plurality of holes 44 in each of the dielectric tape layers 4 at positions registered with the leads 30 for access thereto, as shown in FIG. 5.

Figure 6:
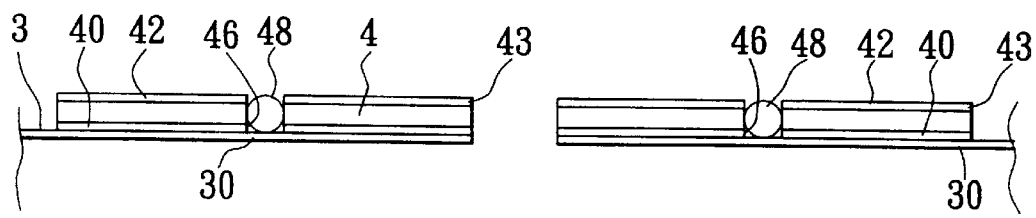

Each of the holes 44 is confined by a wall 46 that cooperates with a registered one of the leads 30 to form a contact receiving space. A plurality of conductive contacts 48 are placed in the contact receiving spaces, respectively. In this embodiment, a tin ball is planted in each contact receiving space and serves as a conductive contact 48, as shown in FIG. 6.

Figure 7:
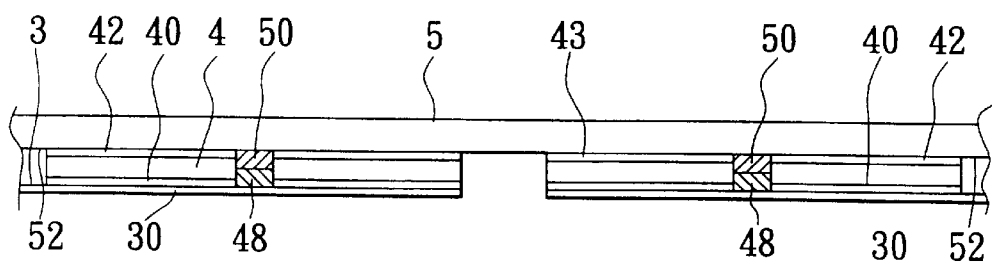
Figure 8:
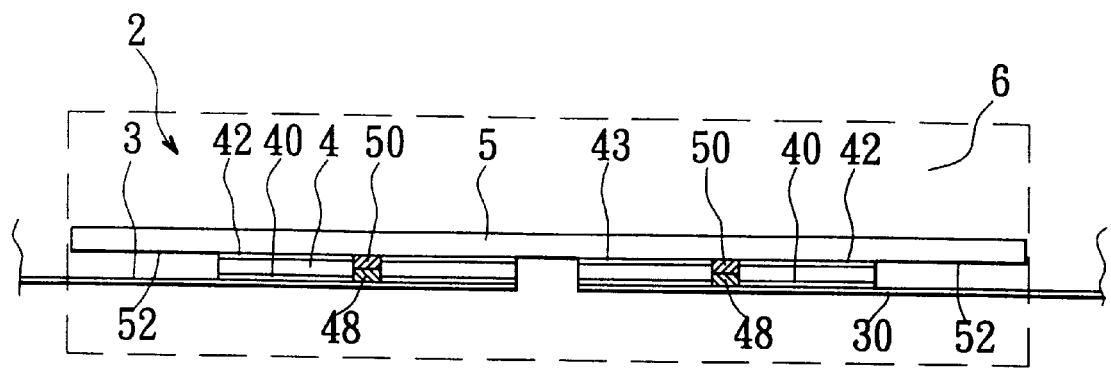
Figure 9:
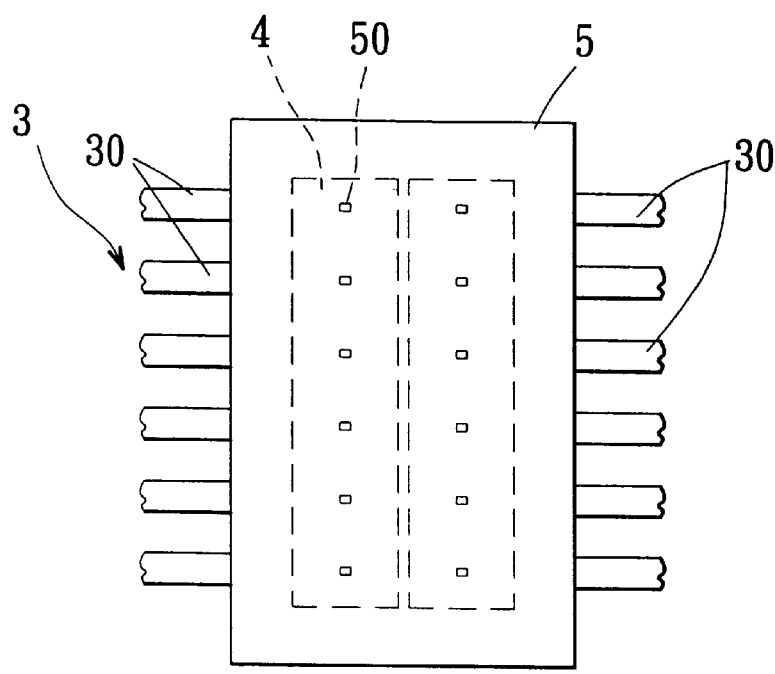
FIG. 9 is a top view of the first preferred embodiment.

The die 5 has a die mounting surface 52 provided with a plurality of contact pads 50 that are arranged at equal intervals in two rows. In this embodiment, the contact pads 50 in the left side row are connected to the leads 30 on the left side of the lead frame 3, while the contact pads 50 in the right side row are connected to the leads 30 on the right side of the lead frame 3, as shown in FIG. 9. The contact pads 50 are to be aligned with and are to be connected to the conductive contacts 48. A heat curing operation is conducted to bond the conductive contacts 48 to the contact pads 50, and to adhere the die mounting surface 52 onto the second adhesive surface 42 of the dielectric tape layer 4, as shown in FIG. 7. Preferably, the second adhesive surface 42 is provided with a heat-curable adhesive 43 having a curing point that is lower than the melting point of the contact pads 43. Thus, the die mounting surface 52 is already adhered onto the second adhesive surface 42 prior to melting of the conductive contacts 48, thereby sealing the contact receiving spaces so that the melt of each conductive contact 48 is prevented from flowing out of the respective contact receiving space to avoid formation of undesired connections with adjacent conductive contacts 48. Thereafter, a dielectric casing 6 is formed using known packaging techniques to enclose the semiconductor die 5 and a portion of the lead frame 3.

Figure 10:
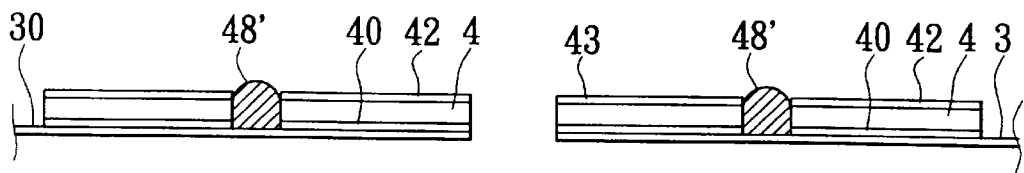
FIG. 10 is a fragmentary schematic, partly sectional view illustrating one of the steps of the method for fabricating the second preferred embodiment of a semiconductor device according to the present invention.

Referring to FIG. 10, in the second preferred embodiment of a semiconductor device according to the present invention, instead of using tin balls as conductive contacts, each conductive contact 48' is formed from conductive paste, such as conductive silver paste.

Figure 11:
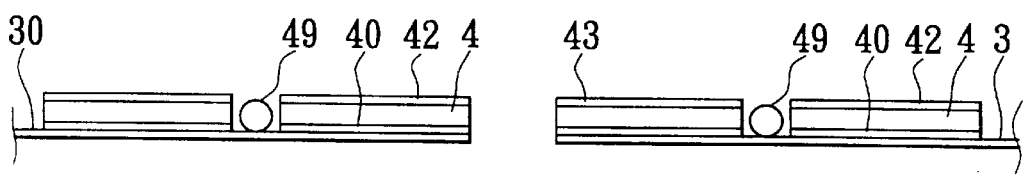
FIGS. 11 and 12 are fragmentary schematic, partly sectional views illustrating some of the steps of the method for fabricating the third preferred embodiment of a semiconductor device according to the present invention.
Figure 12:
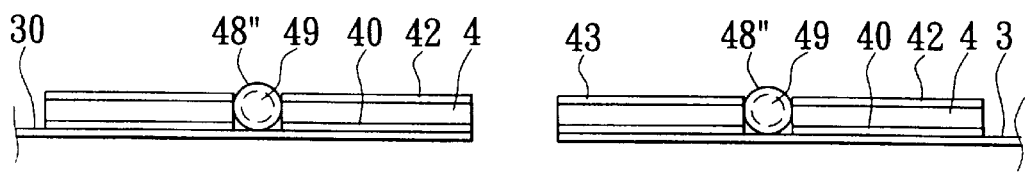

Referring to FIG. 11 and 12, in the third preferred embodiment of a semiconductor device according to the present invention, each conductive contact 48" is formed by placing a conductive metal material 49, such as a gold or aluminum ball, in each contact receiving space. A chemical electroplating process is subsequently performed to complete each conductive contact 48" prior to bonding with the contact pads on the semiconductor die (not shown).

Figure 13:
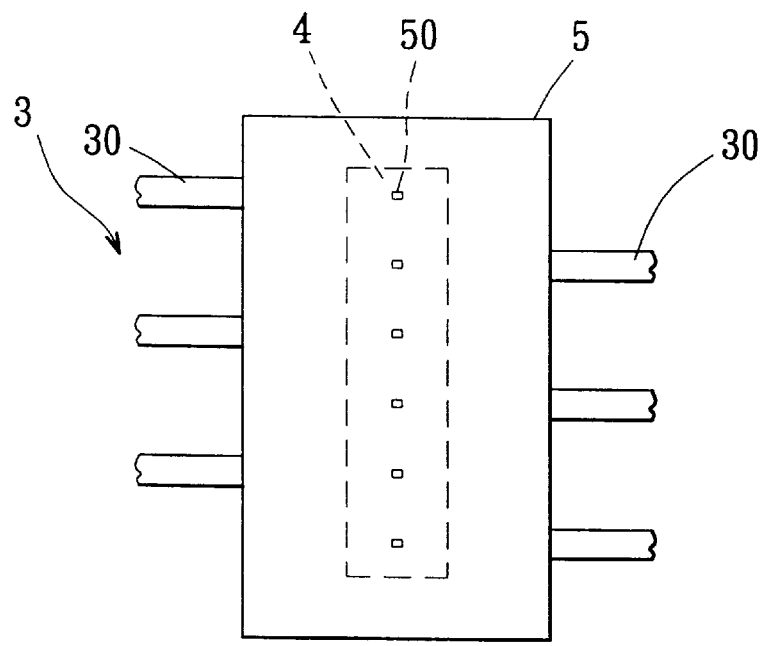
FIG. 13 is a top view showing the fourth preferred embodiment of a semiconductor device according to the present invention.

Referring to FIG. 13, in the fourth preferred embodiment of a semiconductor device according to the present invention, the contact pads 50 are arranged at equal intervals in a single row, and are connected alternately to the leads 30 at the left and right sides of the lead frame 3, which are staggered relative to each other.

Figure 14:
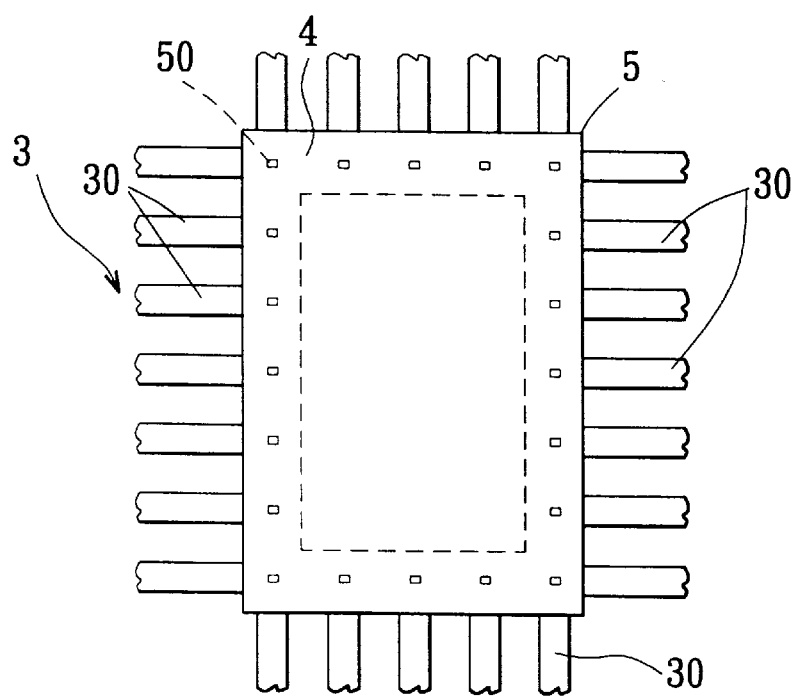
FIG. 14 is a top view showing the fifth preferred embodiment of a semiconductor device according to the present invention.

Referring to FIG. 14, in the fifth preferred embodiment of a semiconductor device according to the present invention, the contact pads 50 are arranged along the periphery of the die 5 at equal intervals. Each contact pad 50 is connected to a corresponding lead 30 provided along the periphery of the lead frame 3.

Figure 15:
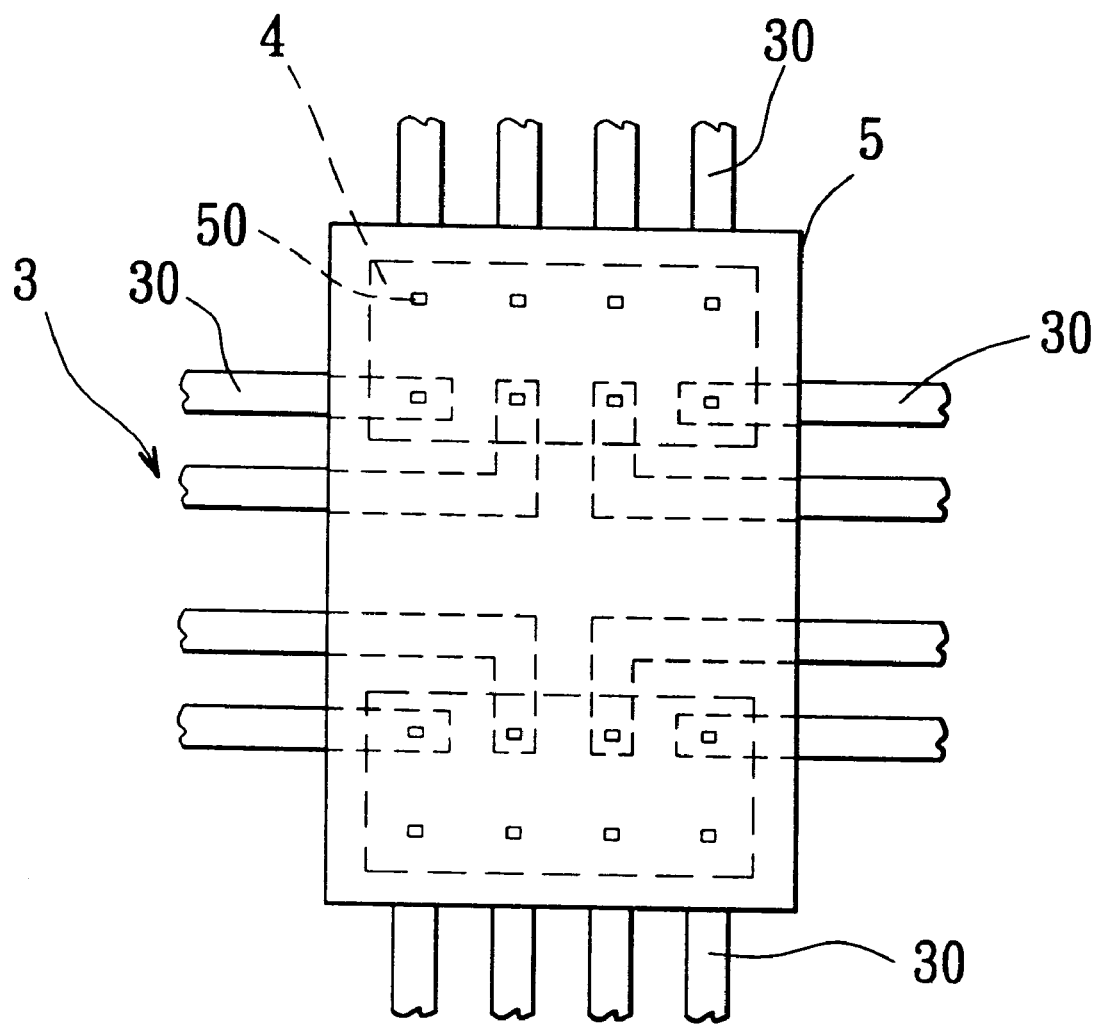
FIG. 15 is a top view showing the sixth preferred embodiment of a semiconductor device according to the present invention.

Referring to FIG. 15, in the sixth preferred embodiment of a semiconductor device according to the present invention, the contact pads 50 are arranged at equal intervals in four rows, such as a front row, a rear row and two intermediate rows. The front and rear rows of contact pads 50 are connected to corresponding leads 30 on front and rear ends of the lead frame 3. The intermediate rows of contact pads 50 are connected to corresponding leads 30 on left and right sides of the lead frame 3.

Figure 16:
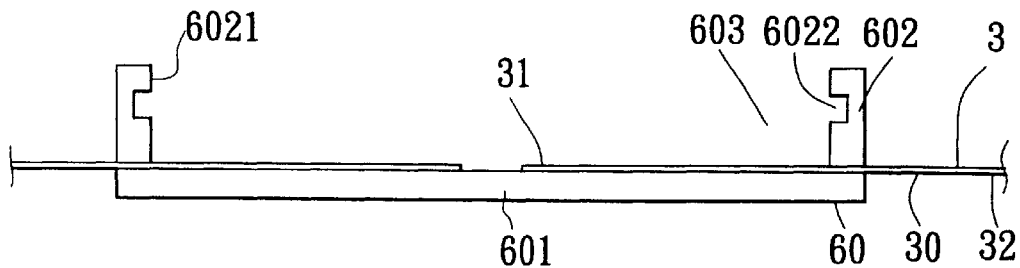
FIGS. 16 and 17 are fragmentary schematic, partly sectional views illustrating some of the steps of the method for fabricating the seventh preferred embodiment of a semiconductor device according to the present invention.
Figure 17:
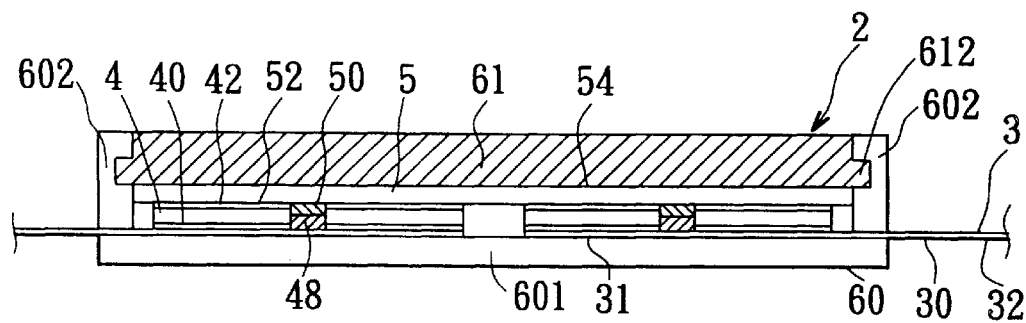

Referring to FIGS. 16 and 17, in the seventh preferred embodiment of a semiconductor device according to the present invention, instead of the dielectric casing 6, the semiconductor device 2 further includes a dielectric housing 60 and a dielectric cover 61. The housing 60, which is made from a moulding compound, has a base plate 601, and a surrounding wall 602 that extends upwardly from a periphery of the base plate 601 and that cooperates with the base plate 61 to confine a receiving space 603. The housing 60 further has an inner peripheral surface 6021. An engaging groove 6022 is formed in the inner peripheral surface 6021 of the housing 60. The lead frame 3 is disposed inside the receiving space 603. Each of the leads 30 has a first end 31 disposed in the housing 60, and a second end 32 extending outwardly of the receiving space 603 through the surrounding wall 602. Subsequently, the dielectric tape layer 4 and the semiconductor die 5 are disposed on the leads 30 of the lead frame 3 in a manner similar to that of the previous embodiments. Thereafter, in this embodiment, the cover 61, which is made from epoxy resin having a melting point lower than that of the moulding compound, is provided on the housing 60 at one side 54 of the semiconductor die 5 opposite to the die mounting surface 52. The cover 61 has an outer peripheral flange 612 engaged within the engaging groove 6022 to seal the receiving space 603 and retain the semiconductor die 5 inside the receiving space. With the construction as such, the semiconductor device 2 can be heated to melt the cover 61 for removing the same in order to facilitate inspection of the semiconductor die 5.

Figure 18:
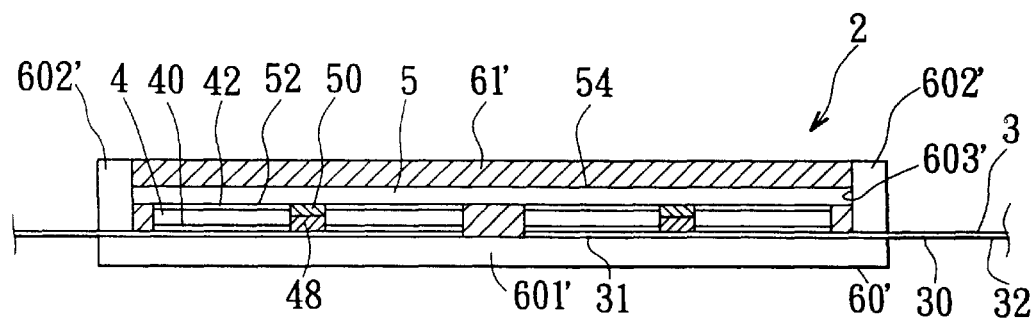
FIG. 18 is a fragmentary schematic, partly sectional view showing the eighth preferred embodiment of a semiconductor device according to the present invention.

Referring to FIG. 18, in the eighth preferred embodiment of a semiconductor device according to the present invention, unlike the seventh preferred embodiment shown in FIG. 17, the cover 61' fills the receiving space 603' of the housing 60' to enclose the semiconductor die 5.

The following are some of the advantages of the present invention:

1. The contact pads 50 of the semiconductor die 5 are electrically connected to the leads 30 of the lead frame 3 via the conductive contacts 48 instead of conductive wires, thereby obviating the need for an expensive wire bonder so as to reduce the fabricating costs.
2. Each of the conductive contacts 48 is confined within a sealed space after adhering the die mounting surface 50 of the semiconductor die 5 onto the dielectric tape layer 4 so as to avoid corrosion and short circuiting due to excessively high humidity.
3. Because the conductive contacts 48 are in use instead of the conventional conductive wires, the production yield can be increased.
4. The cover 61 can be removed by heating, thus facilitating inspection and recycling of the semiconductor die 5.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A semiconductor device, comprising:

a lead frame provided with a plurality of leads;

a dielectric tape layer having a first adhesive surface adhered onto said leads, and a second adhesive surface opposite to said first adhesive surface, said dielectric tape layer being formed with a plurality of holes at positions registered with said leads for access thereto, each of said holes being confined by a wall that cooperates with a registered one of said leads to form a contact receiving space;

a plurality of conductive contacts placed in said contact receiving spaces, respectively; and a semiconductor die having a die mounting surface adhered onto said second adhesive surface of said dielectric tape layer, said die mounting surface being provided with a plurality of contact pads that are bonded to said conductive contacts to establish electrical connection with said leads of said lead frame.

2. The semiconductor device as claimed in claim 1, wherein said second adhesive surface is provided with a heat-curable adhesive having a curing point that is lower than melting point of said conductive contacts.

3. The semiconductor device as claimed in claim 1, wherein each of said conductive contacts is a tin ball.

4. The semiconductor device as claimed in claim 1, wherein each of said conductive contacts is formed from conductive paste.

5. The semiconductor device as claimed in claim 1, wherein each of said conductive contacts is formed from a conductive material that undergoes chemical electroplating prior to bonding with said contact pads.

6. The semiconductor device as claimed in claim 1, further comprising a dielectric casing to enclose said semiconductor die and a portion of said lead frame.

7. A semiconductor device, comprising:

a dielectric housing having a base plate and a surrounding wall extending upwardly from a periphery of said base plate, and cooperating with said base plate to confine a receiving space;

a lead frame disposed inside said receiving space, said lead frame being provided with a plurality of leads, each of said leads having a first end disposed in said housing and a second end extending outwardly of said receiving space through said surrounding wall;

a dielectric tape layer having a first adhesive surface adhered onto said leads in said receiving space of said housing, and a second adhesive surface opposite to said first adhesive surface, said dielectric tape layer being formed with a plurality of holes at positions registered with said leads for access thereto, each of said holes being confined by a wall that cooperates with a registered one of said leads to form a contact receiving space;

a plurality of conductive contacts placed in said contact receiving spaces, respectively;

a semiconductor die having a die mounting surface adhered onto said second adhesive surface of said dielectric tape layer, said die mounting surface being provided with a plurality of contact pads that are bonded to said conductive contacts to establish electrical connection with said leads of said lead frame; and a dielectric cover provided on said housing to seal said receiving space and retain said semiconductor die inside said receiving space.

8. The semiconductor device as claimed in claim 7, wherein said second adhesive surface is provided with a heat-curable adhesive having a curing point that is lower than melting point of said conductive contacts.

9. The semiconductor device as claimed in claim 7, wherein said cover has a melting point lower than that of said housing.

10. The semiconductor device as claimed in claim 9, wherein said cover is disposed at one side of said semiconductor die opposite to said die mounting surface.

11. The semiconductor device as claimed in claim 9, wherein said cover fills said receiving space of said housing.

12. The semiconductor device as claimed in claim 9, wherein said cover is made from epoxy resin.

13. The semiconductor device as claimed in claim 7, wherein each of said conductive contacts is a tin ball.

14. The semiconductor device as claimed in claim 7, wherein each of said conductive contacts is formed from conductive paste.

15. The semiconductor device as claimed in claim 7, wherein each of said conductive contacts is formed from a conductive material that undergoes chemical electroplating prior to bonding with said contact pads.

* * * * *